(12) United States Patent
Martins

(10) Patent No.: US 6,781,536 B1
(45) Date of Patent: Aug. 24, 2004

(54) DUAL-STAGE DIGITAL-TO-ANALOG CONVERTER

(75) Inventor: Marcus M. Martins, Richardson, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 10/436,408

(22) Filed: May 12, 2003

(51) Int. Cl.[7] ............................................. H03M 1/66
(52) U.S. Cl. ..................................... 341/144; 341/154
(58) Field of Search .............................. 341/144, 154, 341/145

(56) References Cited

U.S. PATENT DOCUMENTS

| | | | |
|---|---|---|---|
| 4,543,560 A | 9/1985 | Holloway | |
| 4,918,448 A | * 4/1990 | Hauviller et al. | ............ 341/145 |
| 5,977,898 A | 11/1999 | Ling et al. | |
| 6,414,616 B1 | 7/2002 | Dempsey | |
| 6,448,917 B1 | * 9/2002 | Leung et al. | ................ 341/144 |

* cited by examiner

Primary Examiner—Jean Bruner Jeanglaude
(74) Attorney, Agent, or Firm—W. Daniel Swayze, Jr.; W. James Brady; Frederick J. Telecky, Jr.

(57) ABSTRACT

A dual-stage DAC system is provided that includes a coarse resistor network having a first portion and a second portion that provide a plurality of segment voltages. The coarse resistor network is coupled to a fine resistor network that provides a plurality of tap output voltages corresponding to a selected segment voltage. The output of the fine resistor network can be provided to an amplifier that sets a reference voltage in addition to buffering the output of the fine resistor network. A predetermined current is coupled to one of the first portion and the second portion of the coarse resistor network based on the segment voltage selected.

21 Claims, 5 Drawing Sheets

DUAL-STAGE DIGITAL-TO-ANALOG CONVERTER

TECHNICAL FIELD

The present invention relates to electrical circuits and more particularly to a dual-stage digital-to-analog converter.

BACKGROUND OF INVENTION

A digital-to-analog converter (DAC) converts a digital input, which can include one or more bits of data, into an analog output signal functionally related to the digital input data. A DAC is typically implemented in an integrated circuit or chip, although it can be implemented on a circuit board by an appropriate arrangement of components. DACs further can be utilized in a variety of applications, such as instrumentation applications, level detection applications, drivers for LCD screens, servo tracking, disk drives and communications applications.

A common type of DAC is a linear DAC that generates an analog output signal that varies linearly with respect to the value of the digital input signal. By way of example, a single resistor string voltage scaling DAC produces an analog voltage from a digital word by selectively tapping a voltage-divider resistor string connected between a high and a low voltage reference voltage. Typically, the voltage drop across each resistor is equal to one least significant bit (LSB) of output voltage range.

A dual resistor string DAC, generally referred to as a two-stage cascaded converter, converts a digital word into a corresponding analog signal employing two-cascaded resistor strings. The first stage or resistor string is coupled across two supply voltages, such as a reference voltage and ground. The first resistor string resolves higher order bits of the digital input or control word by selecting one resistor from the first resistor string producing a voltage based on the most significant bits (MSB) of the digital word. The voltage produced by the first resistor string is applied to the ends of a second stage or resistor string. The second resistor string resolves lower order bits of the digital word by selecting a tap of one resistor from the second resistor string via switches based on the least significant bits (LSB) of the digital word. The second resistor string produces an output effectively interpolating the selected first stage segment voltage in accordance with the lower order bits.

FIG. 1 illustrates a conventional dual-stage resistor string DAC system 10. The DAC system 10 includes a first half coarse string (A) 14 and a second half coarse string (B) 16 coupled through a midpoint (MID) 15. The first half coarse sting 14 is coupled to an output of an input amplifier 12. The second half coarse string 16 is coupled to ground through a resistor R3 via a node 17. The input amplifier 12 receives a reference voltage $V_{REF}$ at a positive input terminal and provides the reference voltage $V_{REF}$ at the midpoint 15 via a negative input terminal. The voltage $V_{REF}$ at the midpoint 15 causes a current to flow through the resistors of the second half coarse string 16 and the resistor R3 to ground through the node 17. The same current flows through the first half coarse string 14 causing a voltage $V_{HIGH}$ to be provided at the output of the input amplifier 12. This provides a voltage drop $V_{DROP}$ from the first half coarse string 14 to the midpoint 15 and a similar voltage drop $V_{DROP}$ from the midpoint 15 to the node 17 across the second half coarse string 16. Therefore, the range of the DAC system is set to be $V_{REF}+/-V_{DROP}$. For example, if the voltage reference $V_{REF}$ was selected to be two volts and the resistor R3 was selected such that a voltage drop across the resistor R3 was one volt, then the voltage $V_{HIGH}$ would be at three volts. Other ranges can be provided by varying the selection Of $V_{REF}$ and R3.

A first output of the first half coarse string 14 and a first output of the second half coarse string 16 are coupled to a first input of a fine string 18 via switches $S_A$ and $S_B$. A second output of the first half coarse string 14 and a second output of the second half coarse string 16 are coupled to a second input of the fine string 18 via switches $S_A$ and $S_B$. A MSB control signal ($MSB_{CTL}$) is provided to both the first half coarse string 14 and the second half coarse string 16. A resistor or segment voltage from one of the first half coarse string 14 and the second half coarse string 16 is selected via internal switches to provide a desire output voltage to the fine string 18 based on the MSB control signal. If the resistor selected is in the first half coarse string 14, then the switches $S_A$ are closed and the switches $S_B$ are opened. If the resistor selected is in the second half coarse string 16, then the switches $S_B$ are closed and the switches $S_A$ are opened. A tap from a resistor in the fine string 18 is then selected based on a LSB control signal ($LSB_{CTL}$) to provide an analog voltage signal at a tap output of the fine string 18.

The analog voltage signal at the tap output is provided to a positive input terminal of an output amplifier 20. The output ($DAC_{OUT}$) of the output amplifier 20 corresponds to the analog voltage associated with the MSB and LSB of the digital word provided as input to the DAC system 10. A first gain switch $S_{G1}$ is provided that allows selection of the $DAC_{OUT}$ to have unity gain such that the output $DAC_{OUT}$ is equal to $V_{REF}+/-V_{DROP}$. A second gain switch $S_{GN}$ is provided that allows a user to provide a gain to the tap output signal such that the output $DAC_{OUT}$ is equal $V_{REF}+/-N*V_{DROP}$, where N is the gain provided by the amplifier 20. The selected gain depends on the selection of a resistor R1 coupled between the negative terminal of the output amplifier 20 and the output of the output amplifier 20, and a resistor R2 coupled between the resistor R1 and the reference voltage $V_{REF}$. Other switches and resistor configurations can be employed to provide different gains.

The input amplifier 12 and the output amplifier 20 have offset voltage associated therewith and require trimming in order for the DAC system 10 to provide accurate conversion. The offset voltage is also amplified along with the output signal if the gain of the output amplifier is selected to provide a gain greater than unity. The offset voltage and any gain of the offset voltage is undesirable.

SUMMARY OF INVENTION

The following presents a simplified summary of the invention in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

The present invention relates to a dual-stage DAC system and a method of digital-to analog conversion. The dual-stage DAC system includes a coarse resistor network coupled to a fine resistor network. The coarse resistor network includes a first portion and a second portion that provide a plurality of segment voltages. A segment voltage is selected from one of the first portion and the second portion based on a first set of control bits. The fine resistor network provides a tap output voltage selected from a plurality of tap output voltages that correspond to the selected segment voltage. The selected tap output voltage is selected from the fine resistor network based on a second set of control bits. The output of the fine resistor network is provided to an amplifier that sets a reference voltage and buffers the selected tap output voltage. A predetermined current is coupled to one of the first portion and the second portion of the coarse resistor network based on the state of the first set of control bits and/or the segment voltage selected.

In another aspect of the present invention, a dual-stage DAC system is provided that includes a coarse resistor having a first portion and a second portion that provide a plurality of segment voltages. A segment voltage is selected from one of the first portion and the second portion based on a state of a sampled data word. The selected segment voltage is provided to a fine resistor network that provides a selected tap output voltage selected from a plurality of tap output voltages based on the state of the sampled data word. The output of the fine resistor network is provided to an amplifier that receives the selected tap output voltage and provides a DAC system output voltage. The amplifier is configured as one of a non-inverting amplifier and a voltage follower amplifier based on the state of the sampled data word.

In yet another aspect of the present invention, segment voltages provided by the first portion of the coarse resistor network are above a reference voltage and segment voltages provided by the second portion of the coarse resistor network are below the reference voltage. The reference voltage can be set to an intermediate voltage (e.g., midpoint output voltage) associated with the output voltage of the DAC system. Additionally, the first set of control bits can be associated with a MSB of a sampled data word and the second set of control bits can be associated with a LSB of the sampled data word.

The following description and the annexed drawings set forth certain illustrative aspects of the invention. These aspects are indicative, however, of but a few of the various ways in which the principles of the invention may be employed. Other advantages and novel features of the invention will become apparent from the following detailed description of the invention when considered in conjunction with the drawings.

DETAILED DESCRIPTION OF THE INVENTION

The present invention relates to a dual-stage DAC system. The dual-stage DAC system includes a coarse resistor network having a first portion and a second portion that provide a plurality of segment voltages. The coarse resistor network is coupled to a fine resistor network that provides a plurality of tap output voltages functionally related to a selected segment voltage. A selected tap output voltage of the fine resistor network is provided to an amplifier that sets a reference voltage in addition to buffering the selected tap output voltage of the fine resistor network. A predetermined current is coupled one of the first portion and the second portion of the coarse resistor network based on the segment voltage selected. The output voltage is typically above or below the reference voltage, since the outputs are an even multiple of the selectable voltage levels.

The output range of the DAC is set by the selected predetermined current, such that the output range of the system is not dependent on the gain of the amplifier. Therefore, the offset due to the amplifier is not amplified since the output range is independent of the amplifier. That is the amplifier simply buffers the selected output voltage and the predetermined current sets the range of the system. The amplifier also provides a dual function of setting the reference voltage and buffering the selected output replacing the conventional two amplifier configuration and reducing the silicon area associated with the DAC system.

Figure 2:
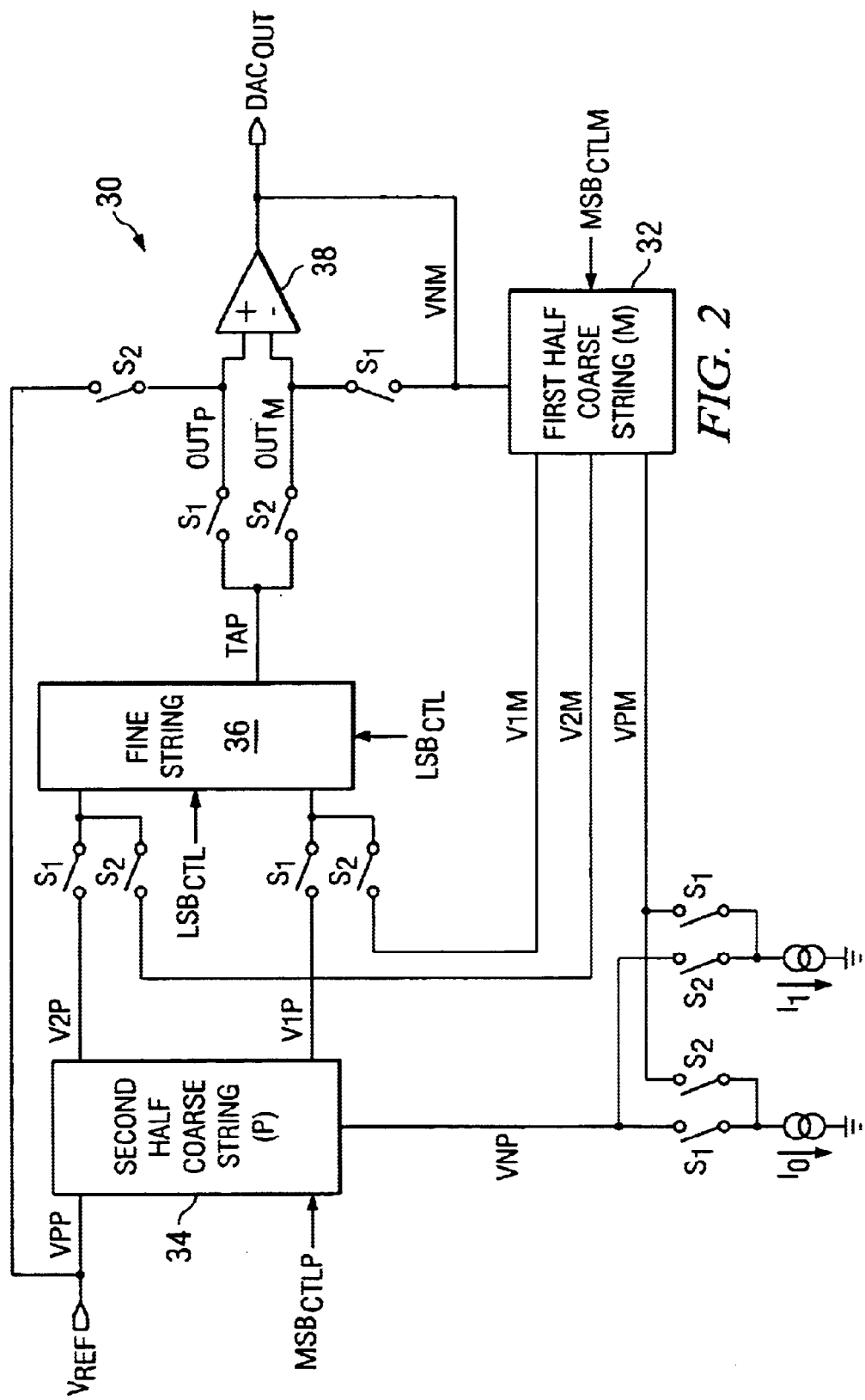
FIG. 2 illustrates a dual-stage DAC system in accordance with an aspect of the present invention.

FIG. 2 illustrates a dual-stage DAC system 30 in accordance with an aspect of the present invention. The DAC system 30 includes a coarse resistor network comprised of a first portion or first half coarse resistor string (M) 32 and a second portion or second half coarse resistor string (P) 34. The first portion and the second portion of the coarse resistor network are illustrated as first and second half coarse strings 32 and 34, however, other coarse resistor network configuration can be employed to carry out the present invention. The coarse resistor network is coupled to a fine resistor network or string 36 through switches $S_1$ and $S_2$. A reference voltage $V_{REF}$ is coupled directly to a first end (VPP) of the second half coarse string 34. The reference voltage $V_{REF}$ is also coupled to a positive input terminal of an amplifier 38 through a switch $S_2$. The amplifier 38 sets the midpoint reference voltage for both the first half coarse string 32 and the second half coarse string 34 in addition to operating as a buffer between an output of the fine string 36 (TAP) and a final DAC output ($DAC_{OUT}$). The voltage drop across the first half coarse string 32 is substantially equal to the voltage drop across the second half string 34 when selected. However, it is to be appreciated that the voltage drop across the first half coarse string 32 can be different than the voltage drop across the second half coarse string 34 to provide an asymmetric DAC for special applications.

A first end (VNM) of the first half coarse string 32 is coupled to the amplifier output ($DAC_{OUT}$), and a negative input terminal of the amplifier 38 through a switch $S_1$. A second end (VPM) of the first half coarse string 32 is coupled to a first current source $I_0$ and a second current source $I_1$ through switches $S_2$ and $S_1$, respectively. A second end (VNP) of the second half coarse string 34 is also coupled to the first current source $I_0$ and the second current source $I_1$ through switches $S_1$ and $S_2$, respectively.

The value of the first current source $I_0$ sets the range or voltage drop across the first half coarse string 32 and the second half coarse string 34, such that $$V_{DROP} = I_0 * R_{TOT1} = I_0 * R_{TOT2}$$  EQ. 1 where $R_{TOT1}$ is equal to the total series resistance of the first half coarse string 32, and $R_{TOT2}$ is equal to the total series resistance of the second half coarse string 34. $R_{TOT1}$ can be selected to be substantially equal to $R_{TOT2}$. Therefore, the output range $V_{RANGE}$ of the DAC system 30 is as follows:

$$V_{RANGE} = V_{REF} +/- V_{DROP} \qquad \text{EQ. 2}$$

where $V_{DROP}$ can be set by the value of the first current source $I_0$. The voltage range of the DAC system 30 is not dependent on the gain of the output amplifier. Therefore, problems associated with the gain of the amplifier offset are mitigated.

It is to be appreciated that the first current source $I_0$ and the second current source $I_1$ can be fixed or variable current sources based on a desired implementation. It is also to be appreciated that the first current source and the second current source can be provided in opposite directions coming from a power supply. In this situation, the voltage output will be below the reference voltage when the first half coarse string 32 is selected and above the reference voltage when the second half coarse string 34 is selected. This can be useful for large output voltage ranges when the circuits that generate the currents do not have enough headroom to operate in a constant current region of operation when they are referenced to ground.

A first output (V1M) of the first half coarse string 32 and a first output (V1P) of the second half coarse string 34 are coupled to a first input of the fine string 36 via switches $S_2$ and $S_1$, respectively. A second output (V2M) of the first half coarse string 32 and a second output (V2P) of the second half coarse string 34 are coupled to a second input of the fine string 36 via switches $S_2$ and $S_1$, respectively. A MSB control signal ($MSB_{CTLM}$) is provided to the first half coarse string 32 and a MSB control signal ($MSB_{CTLP}$) is provided to the second half coarse string 34. The MSB control signals are based on a first set of control bits associated with the MSB of a sampled data word. It is to be appreciated that the control bits provided to the first half coarse string 32 and the second half coarse string 34 can be the same set of control bits (e.g., based on the MSB of a sampled data word) or different sets of control bits.

The first half coarse string 32 and the second half coarse string 34 each include a series connected string of resistors that provide a plurality of segment voltages. A resistor from one of the first half coarse string 32 and the second half coarse string 34 is selected via internal switches (not shown) to provide a desire segment voltage from the plurality of segment voltages to the fine string 36 based on the state of the MSB control signals. The fine string 36 includes a string of series connected resistors with taps therebetween that provide a plurality of tap output voltages. A resistor end or tap of the plurality of resistors from the fine string 36 is selected via a LSB control signal ($LSB_{CTL}$) to provide a desired tap output voltage. The fine string 36 interpolates the segment voltage from the coarse resistor network via the LSB control signal to provide the desired tap output voltage. The LSB control signal is based on a second set of control bits associated with the LSB of a sampled data word.

If the data word that is sampled by the DAC system 30 provides an analog output above $V_{REF}$ (e.g., a data word having a value greater than $2^N/2$, where N is the number of bits in a word), then the first half coarse string 32 is selected by closing switches $S_2$ and opening switches $S_1$, and setting the appropriate control bits for selecting a resistor or segment voltage from the first half coarse string 32. If the data word that is sampled by the DAC system 30 provides an analog output at or below $V_{REF}$ (e.g., a data word having a value less than $2^N/2$), then the second half coarse string 34 is selected by closing switches $S_1$ and opening switches $S_2$, and setting the appropriate control bits for selecting a resistor or segment voltage from the second half coarse string 34.

If a resistor or segment voltage from the first half coarse string 32 is selected, then the switches $S_2$ are closed and the switches $S_1$ are opened. This causes the first current source $I_0$ to be coupled to the second end (VPM) of the first half coarse string 32, and the second current source $I_1$ to be coupled to the second end (VNP) of the second half coarse string 34. The first output (V1M) and the second output (V2M) of the first half coarse string 32 are coupled to the inputs of the fine string 36. The selected tap output voltage of the fine string 36 is provided to the negative input terminal of the amplifier 38 as $OUT_M$, and $V_{REF}$ is provided to the positive input terminal of the amplifier 38. The first end (VNM) of the first half coarse string 32 is coupled directly to the output ($DAC_{OUT}$) of the amplifier 38, and isolated from the negative input terminal of the amplifier 38.

In one aspect of the invention, the logic state of the highest significant bit of the MSB of the sampled data word determines the state of the switches $S_1$ and $S_2$ associated with selecting one of the first half coarse string 32 and the second half coarse string 34. For example, if the highest significant bit of the MSB is a logic "1", the first half coarse string 32 is selected, such that the output voltage is above $V_{REF}$. If the highest significant bit of the MSB is a logic "0", the second half coarse string 34 is selected, such that the output voltage is below $V_{REF}$.

Figure 1:
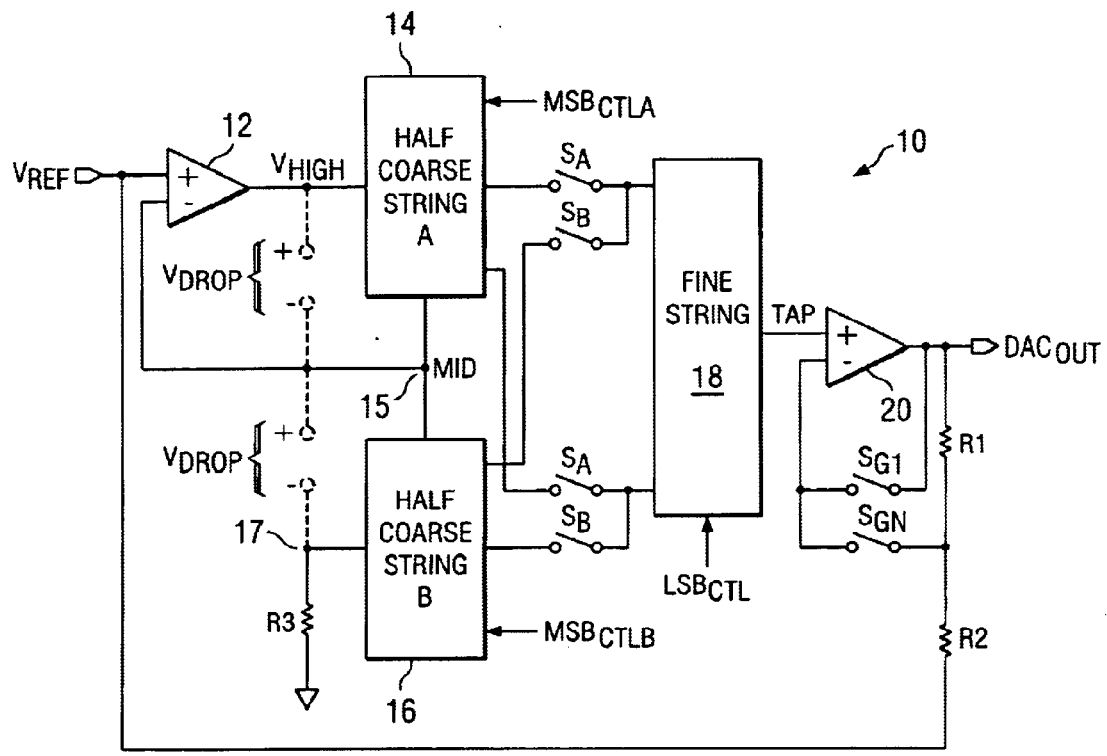
FIG. 1 illustrates a conventional dual-stage resistor string DAC system.
Figure 3:
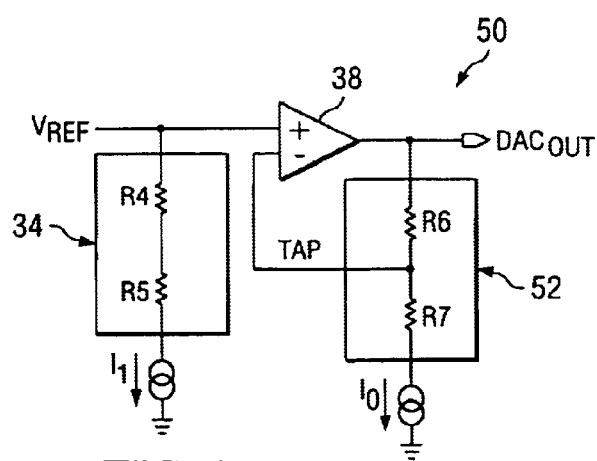
FIG. 3 illustrates a representative circuit of at least a portion of a DAC system when a resistor or voltage segment from a first portion of the coarse resistor network is selected in accordance with an aspect of the present invention.

FIG. 3 illustrates a representative circuit of at least a portion of a DAC system when a resistor or voltage segment from a first portion 32 of the coarse resistor network is selected in accordance with an aspect of the present invention. In the representative circuit 50 of FIG. 3, the reference voltage $V_{REF}$ is provided to the positive input terminal of the amplifier 38. The second half coarse string 34 is represented by a voltage divider formed from resistors R4 and R5 coupled to the second current source $I_1$. Coupling the second current source $I_1$ to the voltage reference $V_{REF}$ input line provides a load on the input line to mitigate problems associated with line impedance. This can be optional based on the specific DAC implementation being employed. The first half coarse string 32 in combination with the fine string 36 is represented by a voltage divider 52 formed from resistors R6 and R7 coupled to the first current source $I_0$. The first current source $I_0$ provides a predetermined current to the first half coarse string 32 when a segment voltage is selected from the first half coarse string 32 based on the state of the MSB control signals.

The amplifier 38 is configured as a non-inverting amplifier, such that the output of the amplifier is equal to the reference voltage $V_{REF}$ plus the voltage across the resistor R6. The amplifier 38 receives the tap output voltage and provides a DAC system output voltage. The amplifier 38 moves the voltage level at the negative input terminal and the TAP output voltage of the fine string 36 to $V_{REF}$ to substantially match the input at the positive input terminal of the amplifier 38. Since substantially zero current flows into the negative terminal of the amplifier 38, the current $I_0$ flows through both R6 and R7 causing the voltage at the output of the amplifier 38 to be driven at a voltage above $V_{REF}$ that is substantially equal to $V_{REF} + I_0 * R6$, where R6 is a function of the selected tap output set by the first half coarse string 32 and the fine string 36.

Referring again to FIG. 2, if a resistor or segment voltage from the second half coarse string 34 is selected, then the switches $S_1$ are closed and the switches $S_2$ are opened. This causes the first current source $I_0$ to be coupled to the second end (VNP) of the second half coarse string 34, and the second current source $I_1$ to be coupled to the second end (VPM) of the first half coarse string 32. The first output (V1P) and the second output (V2P) of the second half coarse string 34 are coupled to the fine string 36. A resistor end or tap selected from a plurality of resistors from the fine string 36 is selected via the LSB control signal ($LSB_{CTL}$). The output of the fine string 36 is provided to the positive input terminal of the amplifier 38 as $OUT_P$, and the output of the DAC ($DAC_{OUT}$) is provided to the negative input terminal of the amplifier 38.

Figure 4:
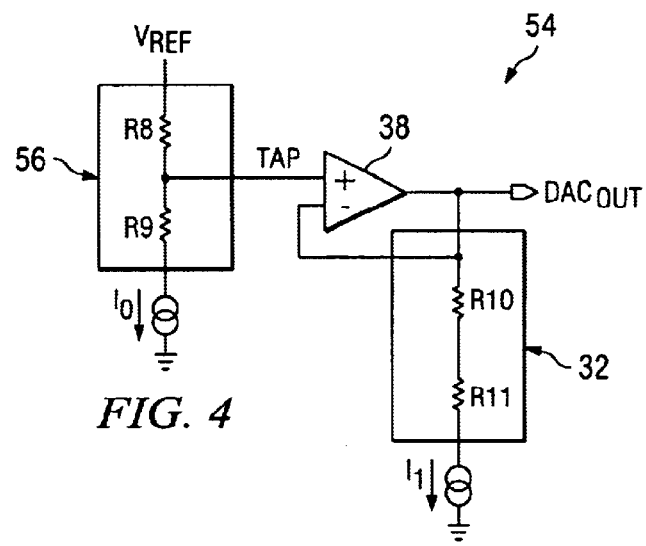
FIG. 4 illustrates a representative circuit of at least a portion of a DAC system when a resistor or voltage segment from a second portion of the coarse resistor network is selected in accordance with an aspect of the present invention.

FIG. 4 illustrates a representative circuit of at least a portion of a DAC system when a resistor or voltage segment from a second portion 34 of the coarse resistor network is selected in accordance with an aspect of the present invention. In the representative circuit of FIG. 4, the second half coarse string 34 and the fine string 36 are represented by a voltage divider 56 formed from resistors R8 and R9 coupled to the first current source $I_0$. The first current source $I_0$ provides a predetermined current that results in a tap voltage (TAP) at the output of voltage divider 56 (e.g., at the output of fine string) when a segment voltage is selected from the second half coarse string 34 based on the state of the MSB control signals.

The first half coarse string 32 is represented by a voltage divider formed from resistors R10 and R11 coupled to the second current source $I_1$. Coupling the second current source $I_1$ to the amplifier output line provides a load on the output line to mitigate problems associated with line impedance. This can be optional based on the specific DAC implementation being employed.

The amplifier 38 is configured as a voltage follower amplifier (or unity gain buffer) such that the voltage provided at the positive input terminal of the amplifier is provided at the output of the amplifier 38. The output voltage at the TAP output of the fine string 36 is provided to the positive input terminal of the amplifier 38. This causes voltage at the negative input terminal and at the output of the amplifier 38 to be driven to substantially the same voltage as the TAP output voltage, which is based on the selected resistors from the second half coarse string 34 and the fine string 36.

It is to be appreciated that the first current source $I_0$ is switched in series with the selected half coarse string, so that the selected one of the first half coarse string 32 and the second half coarse string 34 are subjected to the same current source. For example, if different current sources were selected for the first half coarse string 32 and the second half coarse string 34, then any mismatch or variations (e.g., manufacturing tolerance variations) in the current sources would induce error into the results of the DAC systems 30. Additionally, the second current source $I_1$, is selected to be substantially equal to the first current source $I_0$. Therefore, when the second current source $I_1$ is switched in series with the non-selected half coarse string, the loads associated with the $V_{REF}$ line and the $DAC_{OUT}$ line do not change with the selection of the first half coarse string 32 or the second half coarse 34. This mitigates the problems associated with the line impedance and voltage drops associated therewith.

Figure 5:
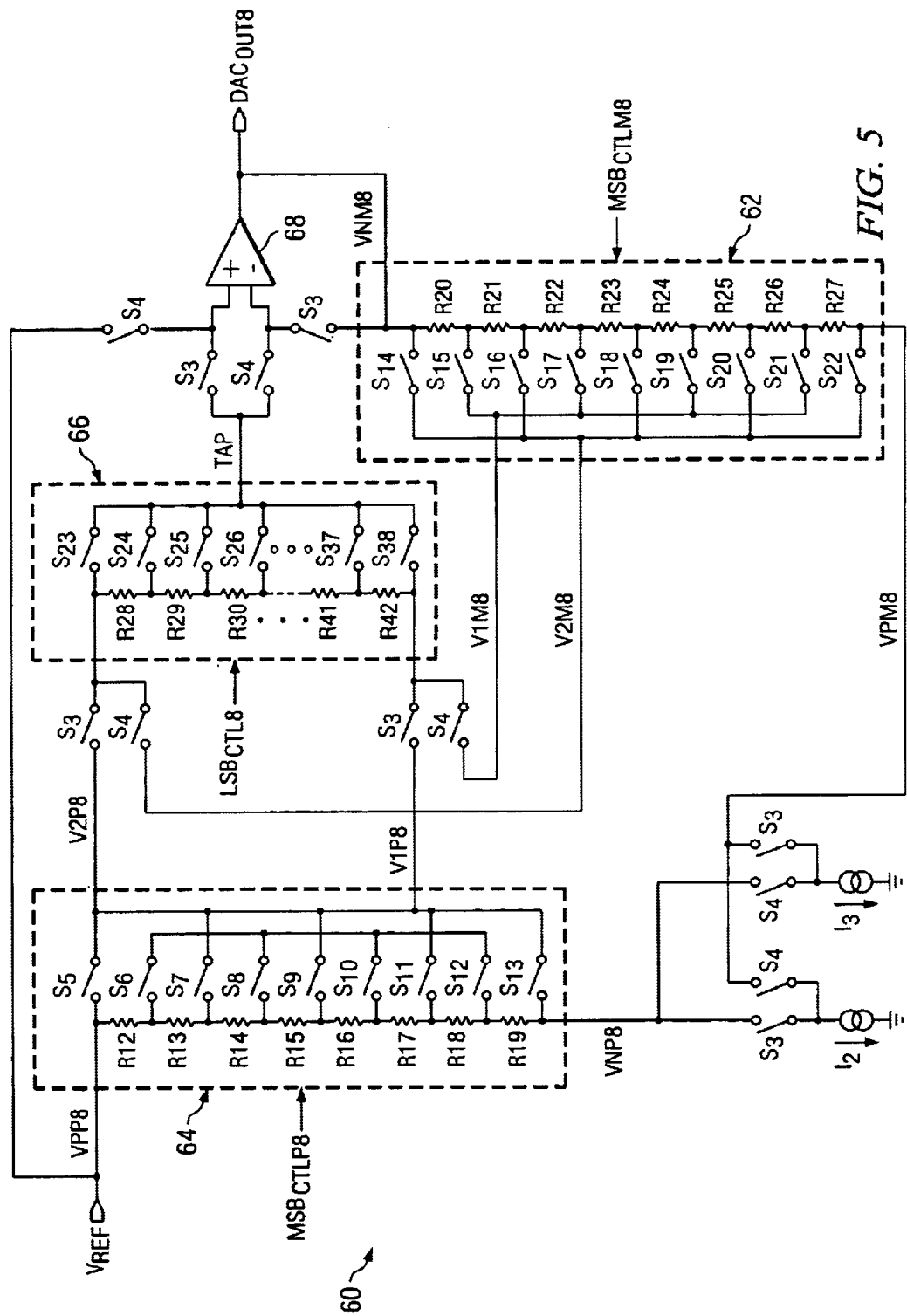
FIG. 5 illustrates an eight-bit implementation of a dual-resistor string DAC system in accordance with an aspect of the present invention.

FIG. 5 illustrates an eight-bit implementation of a dual-resistor string DAC system 60 in accordance with an aspect of the present invention. The DAC system 60 includes a first half coarse string 62 and a second half coarse string 64 coupled to a fine string 66 through switches $S_3$ and $S_4$, respectively. The first half coarse string 62 includes eight resistors (R20–R27) coupled in series and a set of associated switches $S_{14}$–$S_{22}$. The resistors (R20–R27) and the set of associated switches $S_{14}$–$S_{22}$ are configured, such that a pair of switches can be selected to place one of the resistors (R20–R27), and thus its corresponding segment voltage across a first output (V1M8) and a second output (V2M8) of the first half coarse string 62. The second half coarse string 64 includes eight resistors (R2–R19) and a set of associated switches $S_5$–$S_{13}$. The resistors (R12–R19) and the set of associated switches $S_5$–$S_{13}$ are configured, such that a pair of switches can be selected to place one of the resistors (R12–R19), and thus its corresponding segment voltage across a first output (V1P8) and a second output (V2P8) of the second half coarse string 64.

The first output (V1M8) of the first half coarse string 62 and the first output (V1P8) of the second half coarse string 64 are coupled to a first input of the fine string 66 via switches $S_4$ and $S_3$, respectively. The second output (V2M8) of the first half coarse string 62 and the second output (V2P8) of the second half coarse string 64 are coupled to a second input of the fine string 66 via switches $S_4$ and $S_3$, respectively. A MSB control signal ($MSB_{CTLM8}$) is provided to the first half coarse string 62 and a MSB control signal ($MSB_{CTLP8}$) is provided to the second half coarse string 64. The associated MSB control signals selects a resistor (R12–R27) from the first half coarse string 62 or the second half coarse string 64 by closing associated switches corresponding to the selected resistor. The MSB control signals are based on the logic stage of the MSB of a sampled 8-bit data word. It is to be appreciated that the control bits provided to the first half coarse string 62 and the second half coarse string 64 can be the same set of control signals (e.g., based on the MSB of a sampled data word) or different sets of control signals.

The voltage at each end of the resistor selected from the first half coarse string 62 and the second half coarse string 64 is provided to the first and second inputs of the fine string 66 to provide a desired segment voltage to the fine string 66 based on the state of the MSB control signals. The fine string 66 includes fifteen resistors (R28–R42) and a set of associated switches ($S_{23}$–$S_{38}$). The input switches $S_3$ connected in series with one of the switches ($S_5$–$S_{13}$) or $S_4$ connected in series with one of the switches ($S_{14}$–$S_{22}$) provide an additional voltage level to provide a total of sixteen voltage levels between the ends of the selected resistor from the first half coarse string 62 or the second half coarse string 64. The resistors (R28–R42) and the set of associated switches $S_{24}$–$S_{38}$ are configured, such that a switch can be selected to place one of the voltage levels at an end of one of the resistors (R28–R42) at an output (TAP) of the fine string 66. A LSB control signal ($LSB_{CTLM8}$) is provided to the fine string 66. The associated LSB control signal selects a voltage level at an end of one of the resistor (R28–R42) by closing an associated switch corresponding to the selected voltage level. The LSB control signal is based on the logic stage of the LSB of the sampled 8-bit data word.

The reference voltage $V_{REF}$ is coupled directly to a first end (VPP8) of the second half coarse string 64. The reference voltage $V_{REF}$ is also coupled to a positive input terminal of an amplifier 68 through a switch $S_4$. The amplifier 68 sets an intermediate reference voltage (e.g, midvoltage) for both the first half coarse string 62 and the second half coarse string 64 in addition to operating as a buffer between an output of the fine string 66 (TAP) and a final DAC output ($DAC_{OUT8}$). A first end (VNM8) of the first half coarse string 62 is coupled to the amplifier output (DAC$_{OUTS}$), and a negative input terminal of the amplifier 68 through a switch S$_3$. A second end (VPM8) of the first half coarse string 62 is coupled to a first current source I$_2$ and a second current source I$_3$ through switches S$_4$ and S$_3$, respectively. A second end (VNP8) of the second half coarse string 64 is also coupled to the first current source I$_2$ and the second current source I$_3$ through switches S$_3$ and S$_4$, respectively. The value of the first current Source I$_2$ determines the range or voltage drop across the first half coarse string 62 and the second half coarse string 64.

In one aspect of the invention, the highest MSB bit of the MSB of the data word controls the switches S$_3$ and switches S$_4$. For example, if the highest MSB bit is a logic "1" then switches S$_4$ are closed and switches S$_3$ are opened. If the highest MSB bit is a logic "0" then switches S$_4$ are opened and switches S$_3$ are closed. If the MSB of the data word that is sampled by the DAC system 60 has a binary value above "0111", then the first half coarse string 62 is selected. If the MSB of the data word that is sampled by the DAC system 60 has a binary value at or below "0111", then the second half coarse string 64 is selected. If a resistor or segment voltage from the first half coarse string 62 is selected, then the switches S$_4$ are closed and the switches S$_3$ are opened. This causes the first current source I$_2$ to be coupled to the second end (VPM8) of the first half coarse string 62, and the second current source I$_3$ to be coupled to the second end (VNP8) of the second half coarse string 64. The first output (V1M8) and the second output (V2M8) of the first half coarse string 62 are coupled to the inputs of the fine string 66. A tap voltage output from the fine string 66 is selected via the LSB control signal (LSB$_{CTL}$). The tap voltage output of the fine string 66 is provided to the negative input terminal of the amplifier 68 and V$_{REF}$ is provided to the positive input terminal of the amplifier 68. The first end (VNM8) of the first half coarse string 62 is coupled directly to the output (DAC$_{OUT}$) of the amplifier 68, and isolated from the negative input terminal of the amplifier 68.

If a resistor or segment voltage from the second half coarse string 64 is selected, then the switches S$_3$ are closed and the switches S$_4$ are opened. This causes the first current source I$_2$ to be coupled to the second end (VNP8) of the second half coarse string 64, and the second current source 13 to be coupled to the second end (VPM8) of the first half coarse string 62. The first output (V1P8) and the second output (V2P8) of the second half coarse string 64 are coupled to the fine string 66. A voltage level from the fine string 66 is selected via the LSB control signal (LSB$_{CTL}$). The output of the fine string 66 is provided to the positive input terminal of the amplifier 68, and the output of the DAC (DAC$_{OUT}$) is provided to the negative input terminal of the amplifier 68.

Figure 6:
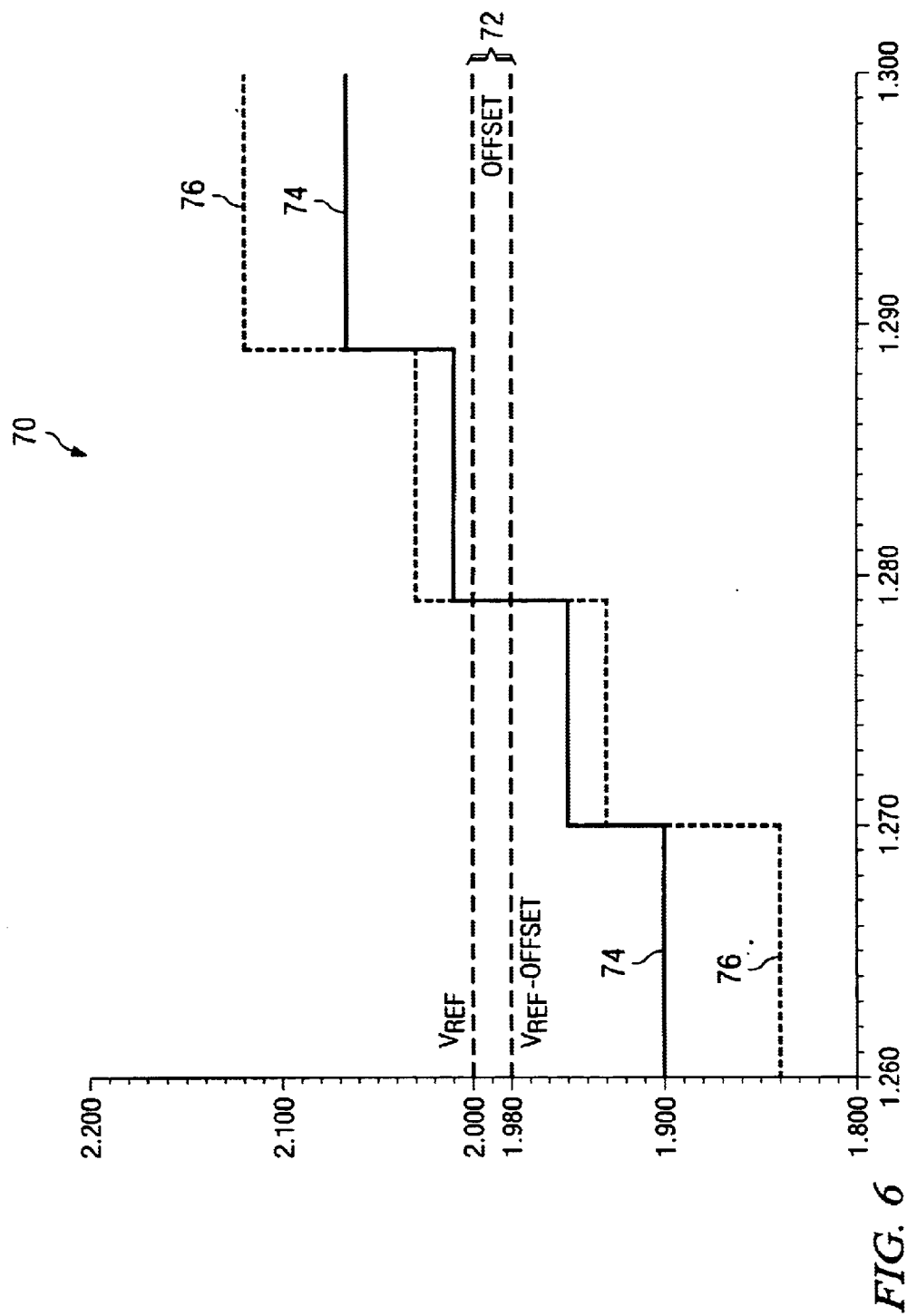
FIG. 6 illustrates a graph of a DAC system output versus time over a plurality of DAC steps in accordance with an aspect of the invention.

FIG. 6 illustrates a graph 70 of DAC system outputs versus time over a plurality of DAC steps for a first output range and a second output range. As illustrated in the graph 70, the first output range provides a first step waveform 74 and a second output range provides a second step waveform 76. As previously discussed, the voltage range of the DAC system is selected based on the value of the current source coupled to the selected one of the first half coarse string and the second half coarse string. The exemplary amplifier has a 20 millivolt offset 72 from the reference voltage of 2.0 volts associated therewith. However, as illustrated in the waveform 74 and 76, the 20 millivolt offset is the same regardless of the selected output range of the DAC system. Therefore, offset voltage gain associated with conventional devices is mitigated.

Figure 7:
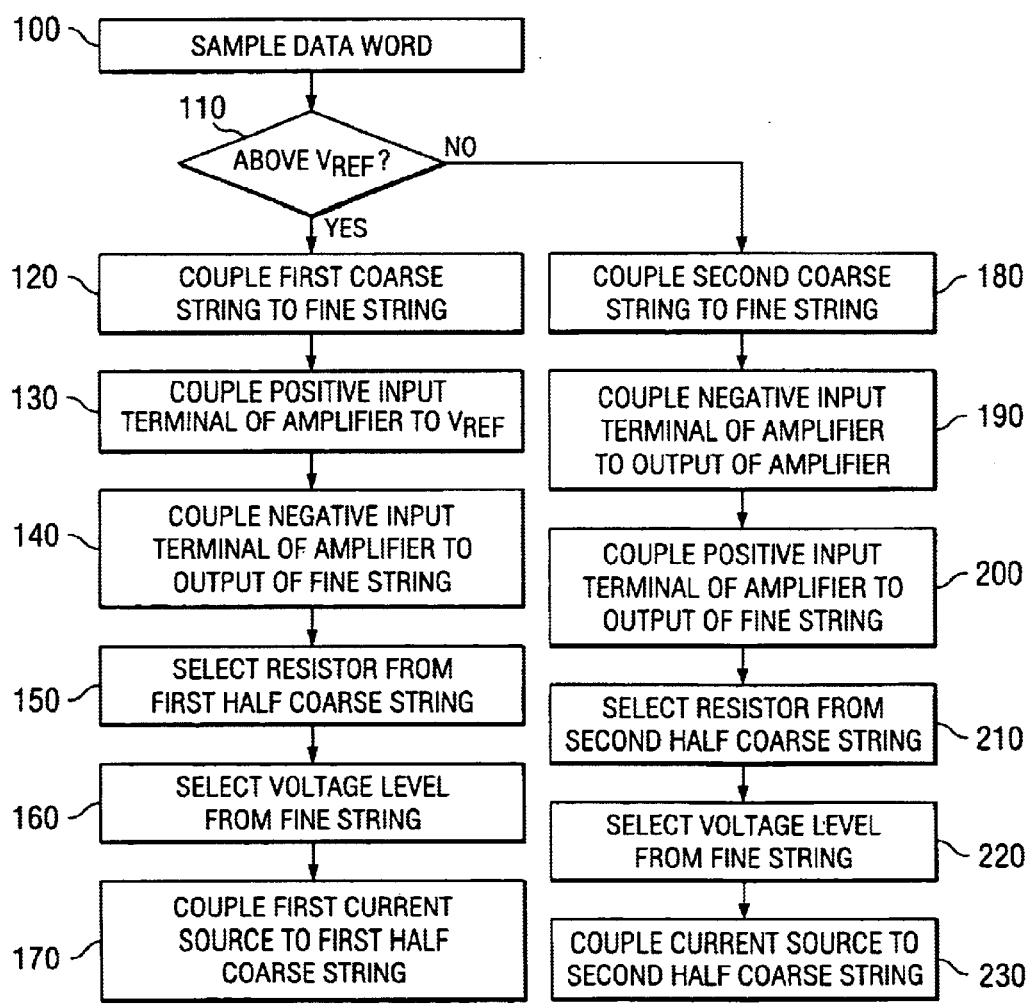
FIG. 7 illustrates a flow diagram of one particular methodology for operating a DAC system in accordance with an aspect of the present invention.

In view of the foregoing structural and functional features described above, a methodology in accordance with various aspects of the present invention will be better appreciated with reference to FIG. 7. While, for purposes of simplicity of explanation, the methodology of FIG. 7 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect of the present invention.

FIG. 7 illustrates a flow diagram of one particular methodology for operating a dual-stage DAC system in accordance with an aspect of the present invention. The DAC system includes a coarse resistor network having a first portion and a second portion that provides a selected segment voltage from a plurality of segment voltages to a fine coarse network. The DAC system employs a single amplifier to set a reference voltage and buffer a selected tap voltage of the fine resistor network functionally related to the selected segment voltage. The methodology begins at 100 where a data word is sampled, and a first set of control bits are set based on the MSB of the data word and a second set of control bits are set based on the LSB of the data word. The methodology then proceeds to 110.

At 110, the methodology (e.g., via a control system) determines if the output voltage corresponding to the data word will be above a reference voltage V$_{REF}$ (e.g., midpoint voltage). If the output voltage corresponding to the data word will be above the reference voltage V$_{REF}$ (YES), the methodology proceeds to 120. At 120, the first portion of the coarse resistor network is coupled to the fine resistor network, for example, via switches. At 130, the positive input terminal of the amplifier is coupled to the reference voltage. At 140, the negative input terminal of the amplifier is coupled to the output of the fine resistor network, such that the amplifier is configured in a non-inverting amplifier configuration. The method then proceeds to 150.

At 150, a resistor or segment voltage is then selected from the first portion of the coarse resistor network based on the logic state of the MSB control bits associated with the sampled data word. At 160, a tap output voltage is selected from the fine resistor network based on the logic state of the LSB control bits associated with the sampled data word. The methodology then proceeds to 170, where a first current source having a predetermined current is coupled to an end of the first portion of the coarse resistor network. A second current source having a predetermined current can be coupled to an end of the second portion of the coarse resistor network to mitigate input line impedance. The DAC system then provides an analog output voltage above the reference voltage V$_{REF}$.

If the output voltage corresponding to the data word will be below the reference voltage V$_{REF}$ (NO) at 110, the methodology proceeds to 180. At 180, the second portion of the coarse resistor network is coupled to the fine resistor network, for example, via switches. At 190, the negative input terminal of the amplifier is coupled to the output of the amplifier. At 200, the positive input terminal of the amplifier is coupled to the output of the fine resistor network such that the amplifier is configured in a voltage follower amplifier configuration. The method then proceeds to 210.

At 210, a resistor or segment voltage is then selected from the second portion of the coarse resistor network at based on the logic state of the MSB control bits associated with the sampled data word. At 220, a voltage level is selected from the fine resistor network based on the logic state of the LSB control bits associated with the sampled data word. The methodology then proceeds to 230 where the first current source is coupled to an end of the second portion of the coarse resistor network. The second current source can be coupled to an end of the first portion of the coarse resistor network to mitigate output line impedance. The DAC system then provides an analog output voltage below the reference voltage $V_{REF}$.

What has been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A dual-stage digital-to-analog converter (DAC) system comprising:
    a coarse resistor network comprised of a first portion and a second portion, the coarse resistor network provides a selected segment voltage from a plurality of segment voltages based on a state of a first set of control bits;
    a fine resistor network that is coupled to the coarse resistor network to receive the selected segment voltage, the fine resistor network provides a selected tap output voltage from a plurality of tap output voltages derived from the selected segment voltage based on a state of a second set of control bits; and
    a controllable current provided to one of the first and second portions of the coarse resistor network based on the state of the first set of control bits.

2. The system of claim 1, further comprising an amplifier provides a buffer between the tap output voltage and the DAC system output voltage.

3. The system of claim 2, the amplifier sets a reference voltage and is configured to provide a DAC system output voltage above the reference voltage if the predetermined current is provided to the first portion of the coarse resistor network, and a DAC system output voltage below the reference voltage if the predetermined current is provided to the second portion of the coarse resistor network.

4. The system of claim 1, further comprising a second predetermined current coupled to the first portion of the coarse resistor network for a first set of states of the first set of control bits and the second predetermined current coupled to the second portion of the coarse resistor network for a second set of states of the first set of control bits, the second predetermined current mitigating line impedance.

5. The system of claim 2, the reference voltage being a midpoint voltage of an output voltage range of the DAC system.

6. The system of claim 1, the value of the predetermined current sets an output voltage range of the DAC system.

7. The system of claim 1, the predetermined current is provided by a current source that is coupled to the first portion of the coarse resistor network for a first set of states of the first set of control bits and the current source is coupled to the second portion of the coarse resistor network for a second set of states of the first set of control bits.

8. The system of claim 1, the first portion of the coarse resistor network being a first half coarse resistor string and the second portion of the coarse resistor network being a second half coarse resistor string.

9. The system of claim 8, the DAC system being an eight-bit DAC system with eight series connected resistors for each of the first and second half coarse resistor strings and fifteen series connected resistors for the fine resistor network with a sixteenth fine connected resistor being formed from a switch connecting the fine resistor network to one of the first and second half coarse resistor strings.

10. A dual-stage digital-to-analog converter (DAC) system comprising:
    a coarse resistor network comprised of a first portion and a second portion, the coarse resistor network provides a selected segment voltage from a plurality of segment voltages based on a state of a first set of control bits;
    a fine resistor network that is coupled to the coarse resistor network to receive the selected segment voltage, the fine resistor network provides a selected tap output voltage from a plurality of tap output voltages derived from the selected segment voltage based on a state of a second set of control bits; and
    a predetermined current provided to one of the first and second portions of the coarse resistor network based on the state of the first set of control bits,
    wherein the amplifier sets a reference voltage and is configured to provide a DAC system output voltage above the reference voltage if the predetermined current is provided to the first portion of the coarse resistor network, and a DAC system output voltage below the reference voltage if the predetermined current is provided to the second portion of the coarse resistor network, and
    wherein the tap output voltage is coupled to a negative input terminal of the amplifier and the reference voltage is coupled to a positive input terminal of the amplifier at DAC system output voltages above the reference voltage, and the tap output voltage is coupled to a positive input terminal of the amplifier and the negative input terminal of the amplifier is coupled to the output of the amplifier for DAC system output voltages below the reference voltage.

11. A dual-stage digital-to-analog converter (DAC) system comprising:
    a coarse resistor network comprised of a first portion and a second portion, the coarse resistor network provides a selectable segment voltage from a plurality of segment voltages based on a state of a sampled data word;
    a fine resistor network that is coupled to the coarse resistor network to receive the selected segment voltage, the fine resistor network provides a selectable tap output voltage from a plurality of tap output voltages based on the state of the sampled data word; and
    an amplifier that receives the tap output voltage and provides a DAC system output voltage, the amplifier being configured as one of a non-inverting amplifier and a voltage follower amplifier based on the state of the sampled data word.

12. The system of claim 11, the amplifier provides a DAC system output voltage above a reference voltage in a non-inverting amplifier configuration and a DAC system output voltage below the reference voltage in a voltage follower amplifier configuration, the reference voltage setting a midpoint voltage for an output voltage range of the DAC system.

13. A dual-stage digital-to-analog converter (DAC) system comprising:
    a coarse resistor network comprised of a first portion and a second portion, the coarse resistor network provides a selected segment voltage from a plurality of segment voltages based on a state of a sampled data word;

a fine resistor network that is coupled to the coarse resistor network to receive the selected segment voltage, the fine resistor network provides a selected tap output voltage from a plurality of tap output voltages based on the state of the sampled data word;

an amplifier that receives the tap output voltage and provides a DAC system output voltage, the amplifier being configured as one of a non-inverting amplifier and a voltage follower amplifier based on the state of the sampled data word; and a first set of switches that configure the amplifier in a non-inverting amplifier configuration and a second set of switches that configure the amplifier in a voltage follower amplifier configuration, the first set of switches coupling the fine resistor network and the first portion of the coarse resistor network to the amplifier and the second set of switches coupling the fine resistor network and the second portion of the coarse resistor network to the amplifier.

14. The system of claim 13, the first set of switches coupling the first portion of the coarse resistor network to a first current source in the non-inverting amplifier configuration and the second set of switches coupling the second portion of the coarse resistor network to the first current source in the voltage follower amplifier configuration.

15. The system of claim 14, the second set of switches coupling the first portion of the coarse resistor network to a second current source in the non-inverting amplifier configuration and the first set of switches coupling the second portion of the coarse resistor network to the second current source in the voltage follower amplifier configuration, the second current source mitigating line impedance.

16. The system of claim 14, the first current source sets an output voltage range of the DAC system.

17. A method for operating a dual-stage digital-to-analog converter (DAC) system having a coarse resistor network with a first portion and a second portion and a fine resistor network coupled to the coarse resistor network, the method comprising:

selecting a segment voltage from a plurality of segment voltages from the coarse resistor network;

providing a tap voltage from a plurality of tap voltages from the fine resistor network associated with a selected segment voltage; and coupling a current source to the first portion of the coarse resistor network for segment voltages selected from the first portion of the coarse resistor network and coupling the current source to the second portion of the coarse resistor network for segment voltages selected from the second portion of the coarse resistor network.

18. The method of claim 17, further comprising providing the tap voltage to an amplifier and configuring the amplifier as a non-inverting amplifier for segment voltages selected from the first portion of the coarse resistor network and configuring the amplifier as a voltage follower for segment voltages selected from the second portion of the coarse resistor network.

19. The method of claim 17, further comprising providing the tap voltage to a negative input terminal of an amplifier and a reference voltage to a positive input terminal of the amplifier for segment voltages selected from the first portion of the coarse resistor network and providing the tap voltage to the positive input terminal of the amplifier and an output of the amplifier to the negative input terminal of the amplifier for segment voltages selected from the second portion of the coarse resistor network.

20. The method of claim 17, further comprising coupling a second current source to the second portion of the coarse resistor network for segment voltages selected from the first portion of the coarse resistor network and coupling the second current source to the first portion of the coarse resistor network for segment voltages selected from the second portion of the coarse resistor network.

21. A method for operating a dual-stage digital-to-analog converter (DAC) system having a coarse resistor network with a first portion and a second portion and a fine resistor network coupled to the coarse resistor network, the method comprising:

selecting a segment voltage from a plurality of segment voltages from the coarse resistor network;

providing a tap voltage from a plurality of tap voltages from the fine resistor network associated with a selected segment voltage; and coupling a current source to the first option of the coarse resistor network for segment voltages selected from the first portion of the coarse resistor network and coupling the current source to the second portion of the coarse resistor network for segment voltages selected from the second portion of the coarse resistor network, wherein a selected value of the current source determining a desired output voltage range of the DAC system.

* * * * *